United States Patent
Span et al.

(10) Patent No.: US 9,899,588 B2
(45) Date of Patent: Feb. 20, 2018

(54) THERMOELECTRIC ELEMENT

(71) Applicant: O-FLEXX TECHNOLOGIES GMBH, Duisburg (DE)

(72) Inventors: Gerhard Span, Wattens (AT); Arwed Siegloch, Duisburg (DE); Juergen Haferkamp, Muelheim / Ruhr (DE); Nikolay Iosad, Taunusstein (DE)

(73) Assignee: O-FLEXX TECHNOLOGIES GMBH, Duisburg (DE)

( * ) Notice: Subject to any disclaimer, the term of this patent is extended or adjusted under 35 U.S.C. 154(b) by 0 days.

(21) Appl. No.: 14/380,272

(22) PCT Filed: Jan. 17, 2013

(86) PCT No.: PCT/EP2013/050802
§ 371 (c)(1),
(2) Date: Aug. 21, 2014

(87) PCT Pub. No.: WO2013/124095
PCT Pub. Date: Aug. 29, 2013

(65) Prior Publication Data
US 2015/0034140 A1    Feb. 5, 2015

(30) Foreign Application Priority Data

Feb. 24, 2012  (DE) .................. 10 2012 101 492
Jun. 20, 2012  (DE) .................. 10 2012 105 373

(51) Int. Cl.
*H01L 35/02* (2006.01)
*H01L 35/32* (2006.01)
(Continued)

(52) U.S. Cl.
CPC .............. *H01L 35/32* (2013.01); *H01L 35/16* (2013.01); *H01L 35/26* (2013.01); *H01L 35/34* (2013.01)

(58) Field of Classification Search
CPC ........................................... H01L 35/02–35/34
(Continued)

(56) References Cited

U.S. PATENT DOCUMENTS 3,554,815 A   1/1971 Osborn
6,046,398 A   4/2000 Foote
(Continued)

FOREIGN PATENT DOCUMENTS

DE   20 2006 002 674 U1   4/2006
JP       H05099759 A       4/1993
(Continued)

OTHER PUBLICATIONS

International Preliminary Report on Patentability (English Translation), dated August 28, 2014 for International Application No. PCT/EP2013/050802.

*Primary Examiner* — Niki Bakhtiari
(74) *Attorney, Agent, or Firm* — Lucas & Mercanti, LLP

(57) ABSTRACT

A thermoelectric element having high thermal resistance and requiring less semiconductor material than a conventional thermoelectric element with comparable performance comprises a substrate having a substrate front side and a substrate rear side opposite the substrate front side, a first contact, applied as a layer to the substrate front side, a second contact, applied as a layer to the substrate front side, a cut-off between the first and second contact which thermally and electrically separates the first and second contact from one another, and a thermoelectrically active layer having a top side and a bottom side, which are connected to one another by lateral delimiting surfaces, wherein the thermoelectrically active layer is arranged in the cut-off in such a way that the bottom side is on the substrate front side, and one of the lateral delimiting surfaces is against the first contact and one of the lateral delimiting surfaces is against (Continued)

the second contact. The invention further relates to a method for producing the thermoelectric element.

13 Claims, 4 Drawing Sheets

(51) Int. Cl.
    *H01L 35/16*     (2006.01)
    *H01L 35/26*     (2006.01)
    *H01L 35/34*     (2006.01)

(58) Field of Classification Search
    USPC .................................................. 136/200–242
    See application file for complete search history.

(56) References Cited

U.S. PATENT DOCUMENTS

| | | |
|---|---|---|
| 6,281,120 B1 | 8/2001 | Strnad |
| 7,351,906 B2 | 4/2008 | Yotsuhashi et al. |
| 8,536,439 B2 | 9/2013 | Teraki |
| 2004/0113076 A1 | 6/2004 | Guo |
| 2005/0178424 A1* | 8/2005 | Yotsuhashi ............. H01L 35/22 136/201 |
| 2006/0076046 A1* | 4/2006 | Ghoshal .................. H01L 27/16 136/205 |
| 2006/0289050 A1 | 12/2006 | Alley |
| 2007/0289620 A1 | 12/2007 | Stark |
| 2009/0014046 A1 | 1/2009 | Yu |
| 2010/0163090 A1* | 7/2010 | Liu ...................... H01L 23/3675 136/224 |
| 2010/0212713 A1* | 8/2010 | Sasaki ..................... H01L 35/32 136/233 |
| 2011/0000517 A1 | 1/2011 | Park |
| 2011/0094556 A1* | 4/2011 | Stark ...................... H01L 35/34 136/205 |
| 2013/0081665 A1 | 4/2013 | Span |

FOREIGN PATENT DOCUMENTS

| | | |
|---|---|---|
| JP | H0629581 | 2/1994 |
| JP | H06188464 A | 7/1994 |
| JP | H10173110 A | 6/1998 |
| JP | 2009158760 A | 7/2009 |
| JP | 2011222873 A | 11/2011 |
| WO | 2005047560 A1 | 5/2005 |
| WO | 2011151144 A2 | 12/2011 |

* cited by examiner

Fig. 3
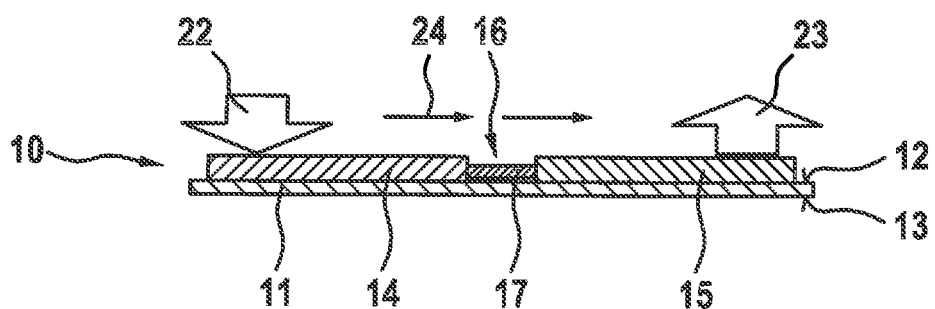
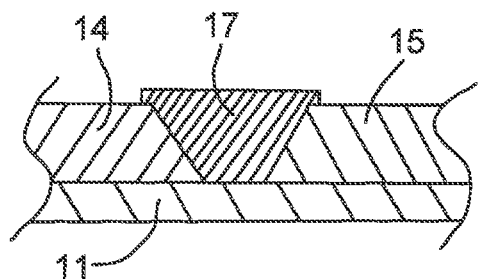
Fig. 4
Fig. 3a
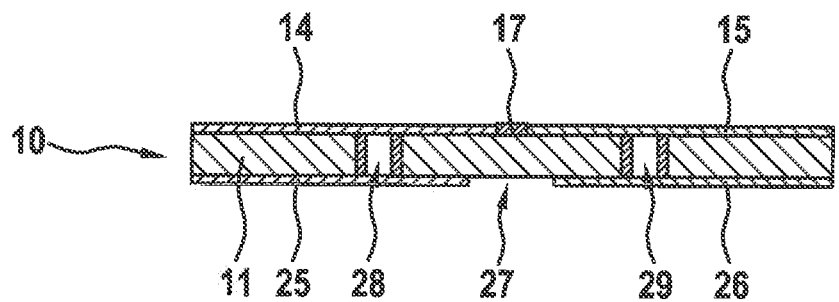

THERMOELECTRIC ELEMENT

CROSS-REFERENCE TO RELATED APPLICATIONS

This application is a 371 of PCT/EP2013/050802 filed Jan. 17, 2013, which in turn claims the priority of DE 10 2012 101 492.2 filed Feb. 24, 2012 and DE 10 2012 105 373.1 filed Jun. 20, 2012, the priority of these applications is hereby claimed and these applications are incorporated by reference herein.

BACKGROUND OF THE INVENTION

The invention relates to a thermoelectric element.

The manner in which thermoelectric elements function relates to the thermoelectric effect:

By virtue of the thermoelectric effect, also referred to as the Seebeck effect, an electric voltage is produced between two points of an electrical conductor or semiconductor, said two points having a different temperature. The Seebeck effect describes the reversible alternating effect between temperature and electricity. The Seebeck voltage is determined by means of:

$$U_{Seebeck} = \alpha \times \delta T$$

where:
δT represents the temperature difference between the hot face and the cold face,
α represents the Seebeck coefficient or rather the thermoelectric power.

The Seebeck coefficient is a measurement of the magnitude of an electric voltage per temperature difference (V/K). The magnitude of the Seebeck coefficient is substantially responsible for the magnitude of the Seebeck voltage.

The thermoelectric elements are embodied preferably from differently doped semiconductor materials, as a consequence of which it is possible to increase considerably the efficiency in comparison to thermoelements that are embodied from metals. Conventional semiconductor materials are, for example, $Bi_2Te_3$, $PbTe$, $Bi_2Se_3$, $SiGe$, $BiSb$ or $FeSi_2$.

Whereas the Seebeck effect describes the production of a voltage, the Peltier effect occurs exclusively as a result of the flow of an external current. The Peltier effect occurs if two conductors or semiconductors that have different electronic thermal capacities are brought into contact with one another and electrons flow from one conductor/semiconductor to the other as a result of an electric current. Using suitable materials, in particular semiconductor materials, it is possible to use the electric current to produce temperature differences or, conversely, to produce electric current from the temperature differences.

In order to obtain sufficiently high voltages, several thermoelectric elements are combined to form a thermoelectric module and are connected in series in an electrical manner and where appropriate are also connected in parallel.

A thermoelectric Peltier module illustrated in FIG. 1 comprises several series-connected thermoelectric elements. The thermoelectric elements (1) comprise in each case small rectangular blocks (2a, 2b) that are embodied from p-doped and n-doped semiconductor material and are provided alternately above and below with metal bridges (3a, 3b). The metal bridges (3a, 3b) form the thermal and electrical contacts of the thermoelectric elements (1) on a, hot or cold face (4, 5) respectively of the thermoelectric module and are mainly arranged between two ceramic plates (6a, 6b) that are arranged at a distance from one another. The differently doped rectangular blocks (2a, 2b) are connected to one another by means of the metal bridges (3a, 3b) in such a manner that they produce a series connection.

Insofar as an electric current is supplied to the rectangular blocks (2a, 2b), the connection sites of the rectangular blocks (2a, 2b) on one face (4, 5) cool down and the connection sites of the rectangular blocks (2a, 2b) on the opposite face (4, 5) warm up in dependence upon the current strength and the current direction. Consequently, the applied current produces a temperature difference between the ceramic plates (6a, 6b). If, however, the temperature prevailing at the opposite-lying ceramic plate (6a, 6b) is different, a current flows into the rectangular blocks (2a, 2b) of each thermoelectric element (1) of the module in dependence upon the temperature difference.

The edge length (7) of the rectangular blocks (2a, 2b) perpendicular to the ceramic plates (6a, 6b) amounts to approx. 3-5 mm. The long edge length (7) requires a high thermal resistance between the hot and cold face (4, 5), so that the Seebeck voltage and the output of the module is greater in comparison to a Peltier module that is illustrated in FIG. 2 and that comprises a shorter edge length (7) of the rectangular blocks (2a, 2b) but with an identical cross section of the rectangular blocks (2a, 2b). However, the rectangular blocks (2a, 2b) that have the longer edge length (7) require more semiconductor material.

The conversion efficiency of the conventional, above-mentioned thermoelectric materials is currently in the range below 5%. This means that the heat flow must amount to more than 20-times the required electrical output. Since the specific thermal conductivity of the conventional, above-mentioned thermoelectric materials is in the range of 1-5 W/mK, the specific thermal conductivity of the thermal contacts of the rectangular blocks must, be considerably above 20-100 W/mK.

The heat flow in the rectangular blocks reduces in the case of an identical cross section of the rectangular blocks (2a, b) as the edge length m increases. The achievable thermal resistances are therefore only dependent upon the specific thermal conductivity and the edge length (7) of the rectangular blocks (2a, b). It is therefore even more difficult to supply heat to thermoelectric elements of the type illustrated in FIG. 2.

BRIEF SUMMARY OF THE INVENTION

On the basis of this prior art, an object of the invention is to provide a thermoelectric element that has a high thermal resistance and in comparison to a conventional thermoelectric element having comparable output requires less semiconductor material. Furthermore, a method for manufacturing thermoelectric elements of this type is proposed.

In detail, the object is achieved by virtue of a thermoelectric element comprising: a substrate having a substrate front face and a substrate rear face that lies opposite the substrate front face, a first contact that is applied as a layer on the substrate front face, a second contact that is applied as a layer on the substrate front face, a gap between the first and second contact, said gap separating the first and second contact thermally and electrically from one another, and a thermoelectrically effective layer having an upper face and a lower face that are connected to one another by lateral boundary surfaces, wherein the thermoelectrically effective layer is arranged in the gap in such a manner that the lower face lies on the substrate front face and, one of the lateral boundary surfaces lies on the first contact and the other of the lateral, boundary surfaces lies on the second contact.

One advantage of the thermoelectric element in accordance with the invention resides in the fact that, whilst taking into consideration the technical limitations, the distance between the first and second contact and consequently the thermal resistance can be freely selected although the thermoelectrically effective material is embodied as a layer, in particular a thin, layer. Despite the high thermal resistance, the installation space required for the thermoelectric element is extraordinarily low since both the electrical and thermal contacts and also the thermoelectrically effective material are applied as layers in a plane on the substrate surface. Furthermore, despite the thermal resistance that is comparable with conventional thermoelectric elements illustrated in FIG. 1, considerably less thermoelectric material is required for the thermoelectrically effective layer that is arranged in the gap.

The disadvantages of the prior art are eliminated by virtue of connecting and disconnecting respectively the supply of heat by way of the lateral boundary surfaces of the thermoelectrically effective layer, whereupon the heat is connected and disconnected by way of the cross section of the rectangular blocks that always remains constant irrespective of their edge length. In the case of the invention, the size of the contact surface between the lateral boundary surfaces and the first and second contact respectively can be varied within wide limits.

The gap is embodied in particular as a groove between the contacts. The lateral edges of the contacts that border the groove on both sides are preferably inclined with respect to the substrate front face. The edges that are inclined in the direction toward the inside of the groove facilitate the deposition of the thermoelectrically effective layer in the gap.

Insofar as the electrical and/or thermal contact of the thermoelectric element is to be made on the substrate rear face, one embodiment of the invention provides that:
- a third contact is applied as a layer on the substrate rear face,
- a fourth contact is applied as a layer on the substrate rear face,
- a gap is arranged between the third and fourth contact and said gap separates the third and fourth contact thermally and electrically from one another,
- at least a first through-connection connects the first and the third contact thermally and electrically to one another, and
- at least a second through-connection connects the second and the fourth contact thermally and electrically to one another.

The through-connection between the front face and the rear face of the substrate between the first and third contact and also between the second and fourth contact can be embodied by way of example as a bore hole through the substrate, said bore hole being metallized on the inside.

In order to further reduce the amount of material used for the thermoelectric element, all layers are preferably applied as thin layers on the substrate front face and on, the substrate rear face. The thickness of the layers that are deposited using methods of thin layer technology is typically in the range of a few micrometers but is at the maximum 100 μm.

If the thermoelectrically effective layer comprises several layers of an adhesive material and several layers of a thermoelectric material and the layers of adhesive material and thermoelectric material alternate between the upper and lower face of the thermoelectrically effective layer, this results in the thermoelectrically effective layer being mechanically more stable than, a, layer that is embodied exclusively from thermoelectric material and has at the same time a lower coefficient of thermal expansion. As a consequence, the lateral boundary surfaces of the thermoelectrically effective layer are prevented in particular from detaching from the first and second contact respectively.

In order to increase the length of the gap, the gap in an advantageous embodiment is not embodied in a linear manner but rather is embodied in particular in a wavy manner or is meander-shaped. In the case of a supposedly constant layer thickness, the lateral boundary surfaces of the thermoelectrically effective layer that lie on the first and second contact increase in comparison to a linear progression. As a consequence, the electrical resistance between the contacts and the thermoelectrically effective layer is reduced. However, the thermal resistance remains sufficiently high in comparison to a linear progression of the gap in the case of a supposedly identical width of the gap. This results in a further improved output of the thermoelectric element.

A method for producing a thermoelectric element in accordance with the invention comprises the steps of applying a metallized layer on a substrate front face of a substrate, structuring a gap in the metallizing layer by means of purposefully removing the metallizing layer from the substrate front face so that the gap divides the metallization into a first contact and a second contact, depositing a thermoelectrically effective layer into the gap so that the gap is at least in part filled with the layer of thermoelectrically effective material.

By way of example, a plate or film, in particular of polyimide, is used as a substrate. The plate can be in particular glass-fiber reinforced. In particular, copper or a different efficient thermally and electrically conductive metal is applied as a metallizing layer. In order to produce the thermally effective layer, it is possible to deposit into the previously structured gap at least thermoelectric material, in particular bismuth, telluride or a different conventional semiconductor material.

Insofar as the thermal and electrical connection is to be achieved on the substrate rear face, the manufacturing method comprises in addition the steps of: applying a metallizing layer on a rear face of the substrate, said rear face lying opposite the substrate front face, structuring a gap in the metallizing layer on the rear face by means of purposefully removing the metallizing layer from the substrate rear face so that the gap divides the metallization into a third contact and a fourth contact, producing at least one first through-connection that connects the first and the third contact thermally and electrically to one another, and producing at least a second through-connection that connects the second and the fourth contact thermally and electrically to one another.

It is likewise preferred to use copper or a different efficient thermally and electrically conductive metal in order to metallize the rear face. In order to produce the through-connection, it is possible to provide bore holes in the substrate and said bore holes are metallized on their part in order to be able to connect to one another in an electrically and thermally conductive manner the metallizing layers that are applied to the front face and the rear face.

The layers are deposited as thin layers preferably using the method of physical or chemical vapor deposition. In particular, the sputtering method is a possible preferred method of physical vapor deposition.

The metallizing layers are preferably structured within the scope of an etching method that is conventional in semiconductor technology. In particular, possible methods are dry etching methods, such as plasma etching, deep reactive ion etching and wet-chemical etching.

Naturally, it is possible within the scope of the invention to implement the structuring using other methods, in particular mechanical erosion methods.

In order to deposit the already mentioned advantageous multi-layer thermoelectrically effective layer in the gap, an adhesive material is initially deposited on the substrate surface. Titanium (Ti) is in particular suitable as an adhesive material. Subsequently, alternating layers of thermoelectric material, such as by way of example bismuth-telluride, and an adhesive material, such as by way of example titanium, are deposited.

BRIEF DESCRIPTION OF THE DRAWINGS

The invention is explained in detail hereinunder with reference to the figures, in which:

FIG. 3 illustrates a first exemplary embodiment of a thermoelectric element in accordance with, the invention, FIG. 3A illustrates a detailed section of the thermoelectric element of FIG. 3 with inclined lateral boundary surfaces, FIG. 4 illustrates a second exemplary embodiment of a thermoelectric element in accordance with the invention.

DETAILED DESCRIPTION OF THE PREFERRED EMBODIMENTS

Figure 1:
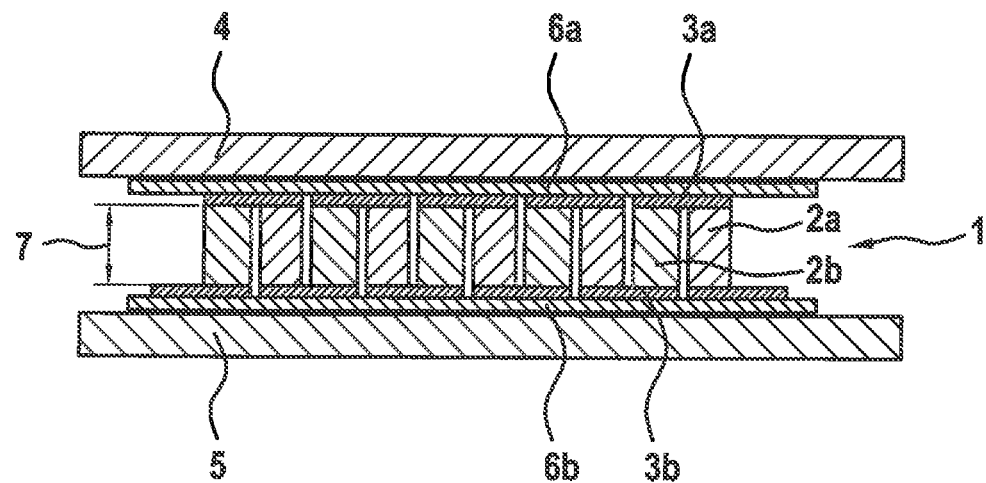
FIG. 1 illustrates a prior art thermo electric element.
Figure 2:
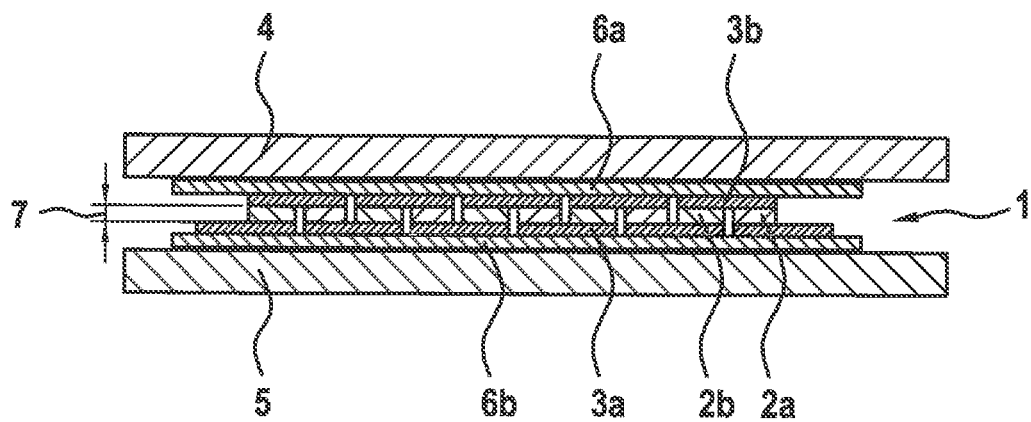
FIG. 2 illustrates another prior art thermoelectric element.
Figure 5:
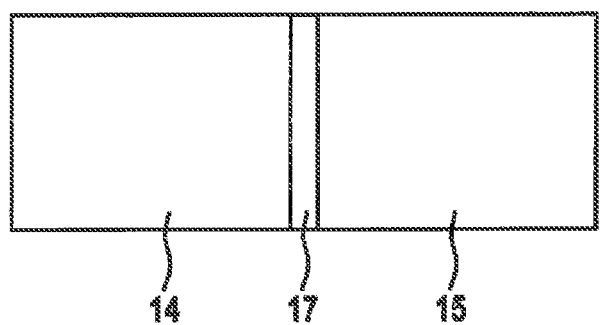
FIG. 5 illustrates a plan view of the front face of the thermoelectric element shown in FIG. 4.

FIG. 3 illustrates a first exemplary embodiment of a thermoelectric element (10) having a planar substrate (11) that is embodied from polyimide and comprises a substrate front face (12) and a substrate rear face (13) that lies opposite the substrate front face (12). A first contact (14) and a second contact (15) are applied as a copper layer on the substrate front face (12). In order to explain the invention, the layers are not illustrated to scale but rather are enlarged. The actual thickness of the copper layer is a maximum 100 μm. In the plan view, the layers that form the two contacts (14, 15) are rectangular. A, gap (16) is provided between the first contact (14) and the second contact (15) and said gap separates the first contact (14) and the second contact (15) thermally and electrically from one another. The gap between the two contacts (14, 15) is embodied in the exemplary embodiment shown in FIG. 3 as a groove that extends in a linear manner and in the plan view (cf. FIG. 5) as a rectangular groove that extends over the entire length of the substrate (11) in the direction of the progression of the groove. A thermoelectrically effective layer (17) is arranged in the gap (16). The thermoelectrically effective layer (17) is defined by an upper face (18), a lower face (19) and the lateral boundary surfaces (20, 21) that connect the upper and lower face (18, 19) to one another, as is evident in the enlarged illustration in FIG. 8.

The thermoelectrically effective layer (17) is arranged in the gap (16) in such a manner that the lower face (19) lies on the substrate front face (12) and one of the lateral boundary surfaces (20) lies on the first contact (14) and one of the lateral boundary surfaces (21) lies on the second contact (15). The heat flow (24) is connected to or respectively disconnected from the thermoelectrically effective layer (17) by way of the lateral, boundary surfaces (20, 21). The thermoelectric element (10) is connected to a heat source (22) with the aid of the first contact (14) and the thermoelectric element (10) is connected to a heat sink (23) with the aid of the second contact (15). The contact surfaces on the first and second contact for the lateral boundary surfaces (20, 21) extend in practice preferably in an inclined manner in order to improve the deposition of the thermoelectrically effective layer (17) using a physical vapor deposition process (See FIG.3A).

Figure 6:
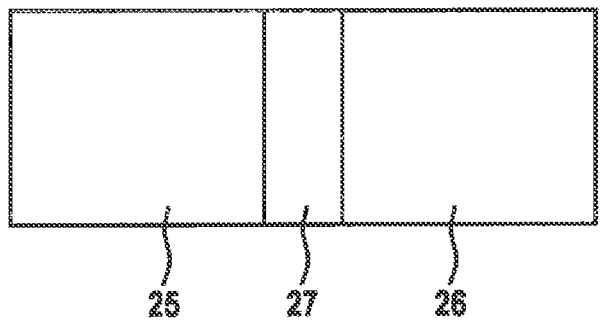
FIG. 6 illustrates a view of the rear face of the thermoelectric element shown in FIG. 4.

The second exemplary embodiment illustrated in FIG. 4 of a thermoelectric element (10) comprises in addition, to the exemplary embodiment shown in FIG. 3 a third contact (25) and a fourth contact (26) that are embodied in each case as a copper layer on the substrate rear face (13). As in the case of the substrate front face (12), there is also a gap (27) between the third and fourth, contact (25, 26) and said gap separates the third and fourth contact (25, 26) thermally and electrically from one another. The gap (27) extends in a linear manner and extends in the direction of progression over the entire length of the substrate (11) as is evident from the rear view of the thermoelectric element (10) in FIG. 6. A through-connection (28) connects the first contact (14) thermally and electrically to the third contact (25) and a through-connection (29) connects the second contact (15) thermally and electrically to the fourth contact (26). The through-connections (28, 29) are embodied as a bore hole through the substrate (11) and the walls of said bore holes are metallized with copper. The additional contacts (25, 26) render it possible to connect or respectively disconnect heat by way of the rear face, wherein the heat flow (24) flows from the heat source (22) over the third contact (25) the through-connection (28), the first contact (14), the thermoelectrically effective layer (17), the second contact (15), the through-connection (29) and the fourth contact (26).

Figure 7:
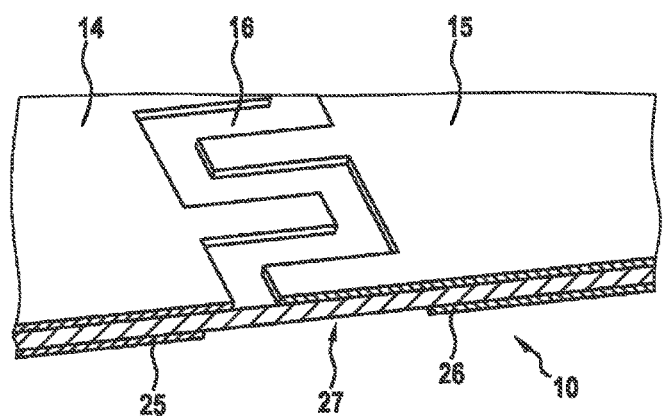
FIG. 7 illustrates a perspective view of a third exemplary embodiment of a thermoelectric element in accordance with the invention.

FIG. 7 illustrates in a perspective view a third exemplary embodiment of a thermoelectric element (10) that corresponds in its construction essentially to the thermoelectric element having metallization on both sides of the substrate shown in FIG. 4. In order to avoid repetitions, reference is made in this respect to the explanations relating to the construction of the thermoelectric element shown in FIG. 4. However, an essential difference exists in that the progression of the gap (16) between the first contact (14) and the second contact (15) does not progress in a linear manner but rather is meander-shaped. In the case of matching dimensions of the substrate (11) of the thermoelectric elements (10) shown in FIGS. 4 and 7, the meander-shaped embodiment of the gap (16) renders it possible to increase the length of the gap. In the case of identical dimensions of the thermoelectric element (10), the lateral boundary surfaces (20, 21) of the thermoelectrically effective layer (17) increase, said boundary layers lie on the first contact (14) and on the second contact (15). This results in a greater cross section of the contact surface in the case of essentially matching thermal resistance between the first and second contact (14, 15) of the thermoelectric element (10) and matching thickness of the thermoelectrically effective layer (17) so that the electrical resistance of the thermoelectric element reduces. An important requirement of thermoelectric elements, namely that they have a high magnitude of electrical conductivity whilst at the same time having a low magnitude of thermal conductivity, is fulfilled by virtue of the non-linear progression of the gap.

The non-linear, in particular meander-shaped, progression of the gap renders it possible in the case of matching magnitudes of electrical conductivity such as that of a linear gap to achieve thinner layer thicknesses of the thermoelectrically effective layer. This produces advantages when manufacturing the thermoelectrically effective layer using physical vapor deposition processes since as layer thicknesses increase, the processes become more complex and more expensive.

Figure 8:
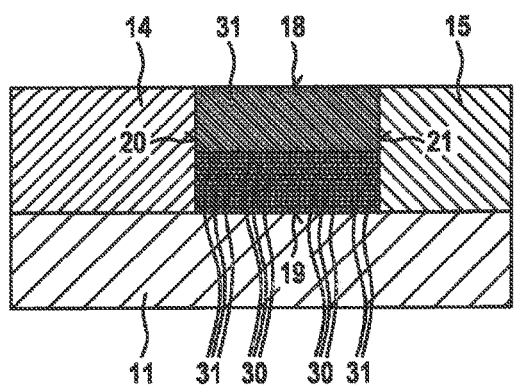
FIG. 8 illustrates an enlarged section of a gap having arranged therein a thermoelectrically effective layer of a thermoelectric element in accordance with the invention.

Finally, FIG. 8 illustrates a preferred construction of the thermoelectrically effective layer (17). The thermoelectrically effective layer comprises alternating layers (30) of an adhesive material, in particular titanium, and layers (31) of a thermoelectric material, in particular bismuth-telluride. This multi-layer construction creates a mechanically stable layer having a lower thermal coefficient of expansion than a purely thermoelectric material. As a consequence, the thermoelectrically effective layer (17) is prevented from becoming detached, at the lateral boundary surfaces (20, 21) from the first and second contact (14, 15).

In order to manufacture the thermoelectric elements shown in FIGS. 3-8, the substrate (11) that is embodied from glass-fiber reinforced polyimide is initially laminated with copper on one face or on both faces.

In a subsequent step, the gap (16) and where appropriate the further gap (27) is structured by means of etching. The thermoelectrically effective layer (17) is subsequently deposited into the groove-shaped gap (16) using a sputtering process. If the thermoelectrically effective layer (17) is multi-layered, the layer of adhesive material (30) is initially deposited on the substrate front face (12) and subsequently alternating layers of thermoelectric material (31) and layers of adhesive material (30) are deposited. Insofar as the thermoelectric element (10) shown in FIGS. 4-7 comprises contacts on both faces, the through-connections (28, 29) must also be produced by means of bore holes in the substrate (11) and subsequently, metallizing the bore holes.

The thermoelectric elements (10) in accordance with the invention are all characterized by virtue of the fact that the heat flow (24) flows in a common plane that extends through the contacts on the front face and the thermoelectrically effective layer. As a consequence, the thermoelectric element (10) is of a compact construction and in the case of a high thermal resistance requires only a small amount of thermoelectrically effective material. In addition, it is possible to reduce the electrical resistance of the thermoelectric element by adjusting the progression of the gap.

List of Reference Numerals

| No. | Description |
| --- | --- |
| 1 | Thermoelectric element |
| 2a, b | Rectangular block |
| 3a, b | Metal bridges |
| 4 | Hot face |
| 5 | Cold face |
| 6 a, b | Ceramic plates |
| 7 | Edge length |
| 8 | — |
| 9 | — |
| 10 | Thermoelectric element |
| 11 | Substrate |
| 12 | Substrate front face |
| 13 | Substrate rear face |
| 14 | First contact |

-continued

List of Reference Numerals

| No. | Description |
| --- | --- |
| 15 | Second contact |
| 16 | Gap |
| 17 | Thermoelectrically effective layer |
| 18 | Upper face |
| 19 | Lower face |
| 20 | Lateral boundary surface |
| 21 | Lateral boundary surface |
| 22 | Heat source |
| 23 | Heat sink |
| 24 | Heat flow |
| 25 | Third contact |
| 26 | Fourth contact |
| 27 | Gap |
| 28 | Through-connection |
| 29 | Through-connection |
| 30 | Layer of adhesive material |
| 31 | Layer of thermoelectric material |
| 32 | |
| 33 | |
| 34 | |
| 35 | |
| 36 | |
| 37 | |
| 38 | |
| 39 | |
| 40 | |
| 41 | |
| 42 | |
| 43 | |
| 44 | |
| 45 | |
| 46 | |
| 47 | |
| 48 | |
| 49 | |
| 50 | |
| 51 | |
| 52 | |
| 53 | |
| 54 | |
| 55 | |
| 56 | |

The invention claimed is:

1. A thermoelectric element, comprising:
a substrate having a substrate front face and a substrate rear face that is opposite the substrate front face;
a first contact applied as a first metallized layer on the substrate front face;
a second contact applied as a second metallized layer on the substrate front face, wherein a gap between the first contact and the second contact provides a thermal separation and an electrical separation of the first contact from the second contact, and a path of the gap in a plane of the substrate front face progresses non-linearly across the substrate front face; and
a thermoelectrically effective layer having an upper face, a lower face, a first lateral boundary surface, and a second lateral boundary surface, wherein the first lateral boundary surface and the second lateral boundary surface connecting the lower face to the upper face, the thermoelectrically effective layer being disposed in said gap such that the lower face lies on the substrate front face, the first lateral boundary surface faces and lies on the first contact; and the second lateral boundary surface faces and lies on the second contact, wherein the thermoelectrically effective layer entirely fills the gap so that the first lateral boundary surface faces and lies entirely on a lateral surface of the first contact, and the second lateral boundary surface faces and lies entirely on a lateral surface of the second contact.

2. The thermoelectric element of claim 1, further comprising:
a third contact applied as a third metallized layer on the substrate rear face; a fourth contact applied as a fourth metallized layer on the substrate rear face, wherein a further gap between the third contact and the fourth contact provides a thermal separation and an electrical separation of the third contact from the fourth contact;
a first through-connection connects the first contact and the third contact electrically and thermally; and
a second through-connection connects the second contact and the fourth contact electrically and thermally.

3. The thermoelectric element of claim 2, wherein the first contact, second contact, and thermoelectrically effective layer are applied as thin layers on the substrate front face, and the third contact and fourth contact are applied as thin layers on the substrate rear face.

4. The thermoelectric element of claim 1, wherein the first contact, second contact, and thermoelectrically effective layer are applied as thin layers on the substrate front face.

5. The thermoelectric element of claim 1, wherein the thermoelectrically effective layer includes a plurality of layers of adhesive material and a plurality of layers of thermoelectric material applied alternatingly between the lower face and the upper face of the thermoelectrically effective layer.

6. The thermoelectric element of claim 1, wherein a thickness of the thermoelectrically effective layer is greater than a thickness of the first contact and a thickness of the second contact, and the thermoelectrically effective layer overlaps in part the first contact and the second contact.

7. A method for manufacturing a thermoelectric element, comprising the steps of:
applying a first metallized layer on a substrate front face of a substrate;
structuring a gap in the first metallized layer by removing a portion of the first metallized layer, thereby dividing the first metallized layer into a first contact and a second contact, wherein the gap provides a thermal separation and an electrical separation of the first contact from the second contact, and a path of the gap in a plane of the substrate front face progressing non-linearly across the substrate front face;
depositing a thermoelectrically effective material into the gap to entirely fill the gap and produce a thermoelectrically effective layer, wherein the thermoelectrically effective layer having an upper face, a lower face, a first lateral boundary surface, and a second lateral boundary surface, wherein the first lateral boundary surface and the second lateral boundary surface connecting the lower face to the upper face and the lower face lies on the substrate front face, wherein the first lateral boundary surface faces and lies entirely on a lateral surface of the first contact, and the second lateral boundary surface faces and lies entirely on a lateral surface of the second contact.

8. The method of claim 7, further comprising the steps of:
applying a second metallized layer on a substrate rear face that lies opposite the substrate front face;
structuring a further gap in the second metallized layer by removing a portion of the second metallized layer, thereby dividing the second metallized layer into a third contact and a fourth contact;
producing a first through-connection that connects the first contact and the third contact thermally and electrically; and
producing a second through-connection that connects the second contact and the fourth contact thermally and electrically.

9. The method of claim 8, wherein the first metallized layer, the second metallized layer, and the thermoelectrically effective layer are applied as thin layers using physical or chemical vapor deposition.

10. The method of claim 7, wherein the first metallized layer and the thermoelectrically effective layer are applied as thin layers using physical or chemical vapor deposition.

11. The method of claim 7, wherein the step of structuring a gap includes etching the gap.

12. The method of claim 7, wherein the step of depositing the thermoelectrically effective material comprises alternatingly depositing layers of adhesive material and thermoelectric material.

13. The method of claim 12, wherein the step of depositing the thermoelectrically effective material including initially depositing a layer of the adhesive material on the substrate front face prior to alternatingly depositing layers of adhesive material and thermoelectric material.

* * * * *